United States Patent
Yasukawa et al.

(10) Patent No.: US 10,672,845 B2
(45) Date of Patent: Jun. 2, 2020

(54) DISPLAY DEVICE AND METHOD OF MANUFACTURING DISPLAY DEVICE

(71) Applicant: Japan Display Inc., Minato-ku (JP)

(72) Inventors: Koji Yasukawa, Minato-ku (JP); Hajime Akimoto, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 16/025,122

(22) Filed: Jul. 2, 2018

(65) Prior Publication Data
US 2019/0013372 A1 Jan. 10, 2019

(30) Foreign Application Priority Data

Jul. 6, 2017 (JP) .................................. 2017-132884

(51) Int. Cl.
| | |
|---|---|
| *H01L 27/32* | (2006.01) |
| *H01L 51/52* | (2006.01) |
| *H01L 51/56* | (2006.01) |
| *H01L 51/00* | (2006.01) |

(52) U.S. Cl.
CPC ...... *H01L 27/3246* (2013.01); *H01L 27/3248* (2013.01); *H01L 27/3258* (2013.01); *H01L 51/5203* (2013.01); *H01L 51/5253* (2013.01); *H01L 51/56* (2013.01); *H01L 51/0097* (2013.01); *H01L 2251/301* (2013.01); *H01L 2251/303* (2013.01); *H01L 2251/5315* (2013.01); *H01L 2251/5338* (2013.01)

(58) Field of Classification Search
None
See application file for complete search history.

(56) References Cited

U.S. PATENT DOCUMENTS

| | | | | |
|---|---|---|---|---|
| 2004/0160170 | A1* | 8/2004 | Sato | H01L 27/3276 313/504 |
| 2014/0117341 | A1* | 5/2014 | Song | H01L 51/0097 257/40 |
| 2014/0183501 | A1* | 7/2014 | Kim | H01L 27/3246 257/40 |
| 2016/0181341 | A1* | 6/2016 | Lee | H01L 27/1222 257/40 |
| 2016/0204185 | A1* | 7/2016 | Iijima | H01L 27/3276 257/91 |

FOREIGN PATENT DOCUMENTS

JP 2014-110132 6/2014

\* cited by examiner

*Primary Examiner* — Jay C Chang
(74) *Attorney, Agent, or Firm* — Oblon, McClelland, Maier & Neustadt, L.L.P.

(57) ABSTRACT

A display device according to an embodiment of the present invention includes: an underlying structure layer; a first lower electrode that is arranged on the underlying structure layer; multiple lower electrodes including a second lower electrode adjacent to the first lower electrode; an organic layer that is arranged on the multiple lower electrodes; an upper electrode that is arranged on the organic layer; a first through hole that is arranged between the first lower electrode and the second lower electrode and includes a first inorganic layer at least in a part of an inner face; and a second inorganic layer that is arranged on the upper electrode and is in contact with the first inorganic layer in the inner face of the first through hole.

17 Claims, 14 Drawing Sheets

DISPLAY DEVICE AND METHOD OF MANUFACTURING DISPLAY DEVICE

CROSS-REFERENCE TO RELATED APPLICATION

The present application claims priority from Japanese application JP2017-132884 filed on Jul. 6, 2017, the content of which is hereby incorporated by reference into this application.

BACKGROUND OF THE INVENTION

1. Field of the Invention

The present invention relates to a display device and a method of manufacturing a display device.

2. Description of the Related Art

Flat panel displays such as organic electroluminescence (EL) display devices include a display panel in which a thin film transistor (TFT), an organic light-emitting diode (OLED), or the like is formed on a substrate.

In JP 2014-110132A, a configuration is disclosed in which an organic light emitting diode having a lower electrode layer, an organic layer, and an upper electrode layer on the upper side of an underlying structure layer such as a substrate or a film thickness adjusting layer and a bank disposed on the lateral side of the organic light emitting diode are included.

SUMMARY OF THE INVENTION

However, in the configuration of the related art described above, there is concern that some organic light emitting diodes among multiple organic light emitting diodes do not emit light. In other words, in the configuration of the related art described above, when a certain impact is applied to the organic light emitting diode such as a case in which the organic EL device falls from the upper side or a case in which a certain object collides with the display panel, a case in which a stress causing the display panel to bend is applied, or the like, peeling-off may occur between the lower electrode layer and the organic layer inside the organic light emitting diode, between multiple layers configuring the organic layer, or between the organic layer and the upper electrode layer. In addition, as a result of the occurrence of peeling-off in a constituent layer inside the organic light emitting diode, the organic light emitting diode may not emit light.

The present invention has been made in consideration of the problems described above, and is to reduce a possibility that an organic light emitting diode does not emit light by reducing a possibility of the occurrence of peeling-off in a constituent layer inside the organic light emitting diode.

(1) A display device according to an embodiment of the present invention includes: an underlying structure layer; a first lower electrode that is arranged on the underlying structure layer; multiple lower electrodes including a second lower electrode adjacent to the first lower electrode; an organic layer that is arranged on the multiple lower electrodes; an upper electrode that is arranged on the organic layer; a first through hole that is arranged between the first lower electrode and the second lower electrode and includes a first inorganic layer at least in a part of an inner face; and a second inorganic layer that is arranged on the upper electrode and is in contact with the first inorganic layer in the inner face of the first through hole.

(2) In the display device as described in (1) above, at least a part of the first inorganic layer is arranged closer to the underlying structure layer than a position between the upper electrode and the organic layer.

(3) In the display device as described in (1) above, at least a part of the first inorganic layer is arranged closer to the underlying structure layer than a position between two layers included in the organic layer.

(4) In the display device as described in (1) above, at least a part of the first inorganic layer is arranged closer to the underlying structure layer than a position between the organic layer and the lower electrode.

(5) In the display device as described in (1) above, a bank covering an end portion of the lower electrode is arranged, the first through hole is arranged inside the bank, the first inorganic layer is arranged at least in a part of the bank and is exposed from the inner face of the first through hole, and the second inorganic layer is arranged from an upper side of the upper electrode and an upper side of the bank to the inner face of the first through hole and is in contact with the first inorganic layer.

(6) In the display device as described in (5) above, further includes: a second through hole that is arranged inside the bank; the first inorganic layer is arranged at least in a part of the bank and is exposed from an inner face of the second through hole, and the second inorganic layer is arranged on the upper electrode and in the inner face of the second through hole and is in contact with the first inorganic layer.

(7) In the display device as described in (1) above, a bank covering an end portion of the lower electrode is arranged, the first through hole is arranged in the bank, the first through hole reaches the underlying structure layer, the first inorganic layer is in contact with at least a part of the underlying structure layer and is exposed from the inner face of the first through hole, and the second inorganic layer is arranged on the upper electrode and in the inner face of the first through hole and is in contract with the first inorganic layer.

(8) In the display device as described in (7) above, further includes: a second through hole that is arranged in the bank and reaches the underlying structure layer; the first inorganic layer is in contact with at least a part of the underlying structure layer and is exposed from the inner face of the second through hole, and the second inorganic layer is arranged on the upper electrode and in the inner face of the second through hole and is in contact with the first inorganic layer.

(9) In the display device as described in (1) above, at least apart of the inner face of the first through hole has an inclination angle of 85 degrees or more with respect to an upper face of a flattening film included in the underlying structure layer.

(10) In the display device as described in (6) above, at least a part of the inner face of the second through hole has an inclination angle of 85 degrees or more with respect to an upper face of a flattening film included in the underlying structure layer.

(11) In the display device as described in (1) above, the first inorganic layer contains at least one of silicon nitride, silicon oxide, and silicon oxynitride as a composition material.

(12) In the display device as described in (1) above, the second inorganic layer contains at least one of silicon nitride, silicon oxide, and silicon oxynitride as a composition material.

(13) In the display device as described in (1) above, stacking body containing materials of the organic layer and the upper electrode is arranged at the bottom of the first through hole.

(14) In the display device as described in (6) above, a stacking body containing materials of the organic layer and the upper electrode is arranged at the bottom of the second through hole.

(15) A manufacturing method of a display device according to an embodiment of the present invention includes: preparing an underlying structure layer; disposing a first lower electrode on the underlying structure layer; disposing multiple lower electrodes including a second lower electrode adjacent to the first lower electrode; disposing an organic layer on the multiple lower electrodes; disposing an upper electrode on the organic layer; disposing a first through hole having a first inorganic layer at least in a part of an inner face between the first lower electrode and the second lower electrode; disposing a second inorganic layer on the upper electrode; and bringing the first inorganic layer and the second inorganic layer into contact with each other in the inner face of the first through hole.

(16) In the manufacturing method of the display device as described in (15) above, the underlying structure layer including the first inorganic layer is prepared in the preparing of an underlying structure layer, and the first inorganic layer in the underlying structure layer is exposed from at least a part of the inner face of the first through hole in the disposing of the first through hole.

(17) In the manufacturing method of the display device as described in (15) above, further includes: disposing a bank including the first inorganic layer between the first lower electrode and the second lower electrode on the underlying structure layer; the first inorganic layer in the bank is exposed from at least a part of the inner face of the first through hole in the disposing of the first through hole.

DETAILED DESCRIPTION OF THE INVENTION

Embodiment

Figure 1:
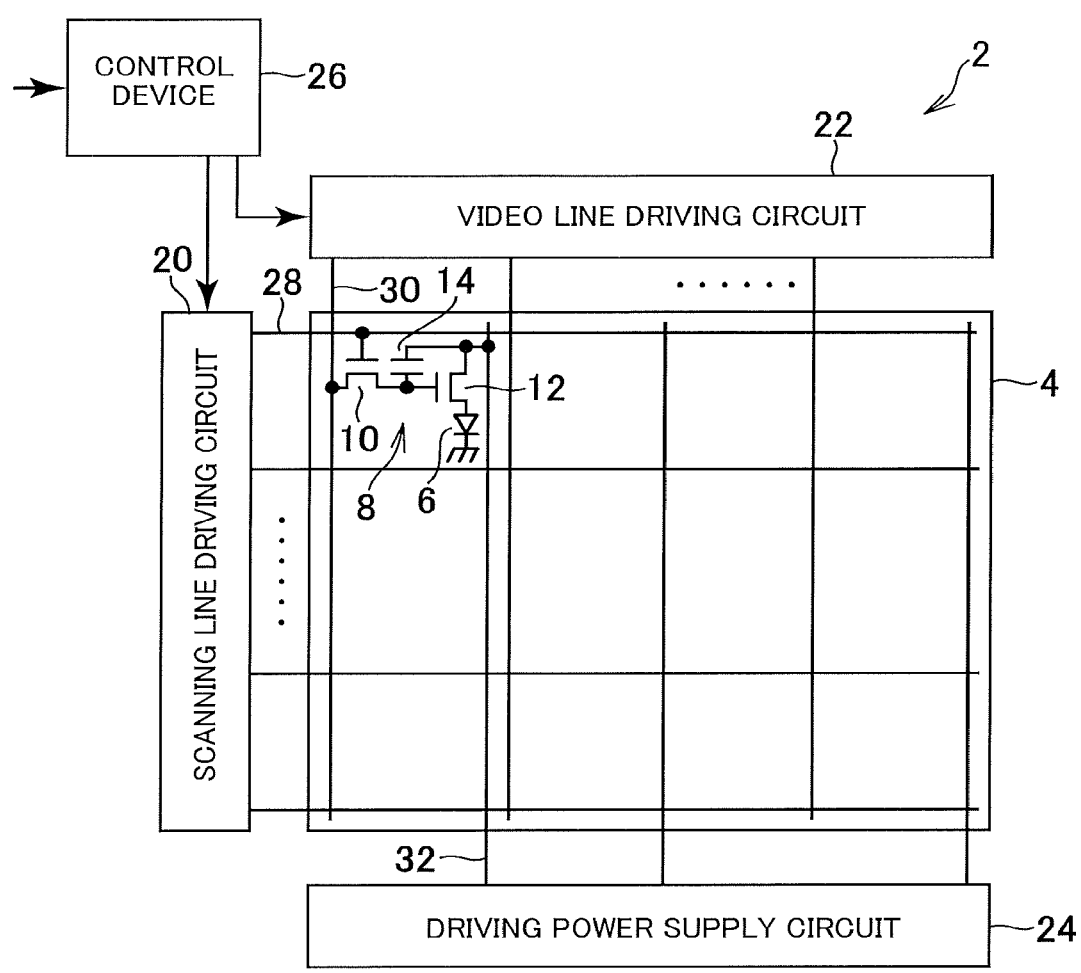
FIG. 1 is a schematic diagram illustrating a schematic configuration of a display device according to the embodiment.

Hereinafter, embodiments of the present invention will be described with reference to the drawings.

In addition, the disclosure is merely an example, and it is apparent that an appropriate change that can be acquired by a person skilled in the art with the main concept of the present invention being maintained belongs to the scope of the present invention. Furthermore, while the drawing is for further clarification of the description, and there are cases where the width, the thickness, the shape, and the like of each unit are illustrated more schematically than those of an actual form, these are merely an example, and the interpretation of the present invention is not limited thereto. In addition, in the present specification and each diagram, a same reference numeral is assigned to each element similar to that described in a former diagram, and detailed description thereof may not be presented as is appropriate.

In this specification and the claims, in representing a form in which, on a certain structure body, another structure body is arranged, representation of only "on", unless otherwise mentioned, includes both a case in which another structure body is arranged right on the upper side of a certain structure body so as to be in contact therewith and a case in which another structure body is arranged on the upper side of a certain structure body via a further another structure body. In addition, representation of only "under", unless otherwise mentioned, includes both a case in which another structure body is arranged right under a certain structure body so as to be in contact therewith and a case in which another structure body is arranged on the lower side of a certain structure body via a further another structure body.

A display device 2 according to the embodiment, for example, is an organic electroluminescence display device and is mounted in a television set, a personal computer, a portable terminal, a mobile phone, or the like. FIG. 1 is a schematic diagram illustrating a schematic configuration of the display device 2 according to the embodiment. The display device 2 includes a pixel array unit 4 displaying an image and a driving unit driving the pixel array unit 4. The display device 2 is a flexible display and includes a wiring layer including a base that is formed using a resin film having flexibility or the like and wiring disposed on the inside or the upper side of the base.

In the pixel array unit 4, organic light emitting diodes and pixel circuits 8 are arranged in a matrix pattern in correspondence with pixels. A pixel circuit 8 includes a lighting thin film transistor (TFT) 10, a driving TFT 12, a capacitor 14, and the like.

The driving unit includes a scanning line driving circuit 20, a video line driving circuit 22, a driving power supply circuit 24, and a control device 26 and controls light emission of the organic light emitting diodes 6 by driving the pixel circuits 8.

The scanning line driving circuit 20 is connected to scanning signal lines 28 arranged for each horizontal line (pixel row) of the pixels. The scanning line driving circuit 20 sequentially selects the scanning signal lines 28 in accordance with a timing signal input from the control device 26 and applies a voltage for causing the lighting TFT 10 to be turned on to a selected scanning signal line 28.

The video line driving circuit 22 is connected to video signal lines 30 arranged for each line (pixel column) in the vertical direction of pixels. A video signal is input to the video line driving circuit 22 from the control device 26 and the video line driving circuit 22 outputs a voltage corresponding to a video signal of a selected pixel row in accordance with selection of scanning signal lines 28 using the scanning line driving circuit 20 to each video signal lines 30. The voltage is written into the capacitor 14 via the lighting TFT 10 in the selected pixel row. The driving TFT 12 supplies a current corresponding to a written voltage to the organic light emitting diode 6, whereby the organic light emitting diode 6 of a pixel corresponding to the selected scanning signal line 28 emits light.

The driving power supply circuit 24 is connected to driving power supply lines 32 arranged for each pixel column and supplies a current to the organic light emitting diode 6 via the driving power supply line 32 and the driving TFT 12 of the selected pixel row.

Here, a lower electrode of the organic light emitting diode 6 is connected to the driving TFT 12. On the other hand, an upper electrode layer of each organic light emitting diode 6 is configured as a common electrode that is common to the organic light emitting diodes 6 of all the pixels. In a case in which the lower electrode is configured as a positive electrode (anode), a high electric potential is input to the lower electrode. In that case, the upper electrode layer is configured a negative electrode (cathode), and a low electric potential is input to the upper electrode layer. On the other hand, in a case in which the lower electrode is configured as a negative electrode (cathode), a lower electric potential is input to the lower electrode. In that case, the upper electrode layer is configured as a positive electrode (anode), and a high electric potential is input to the upper electrode layer.

Figure 2:
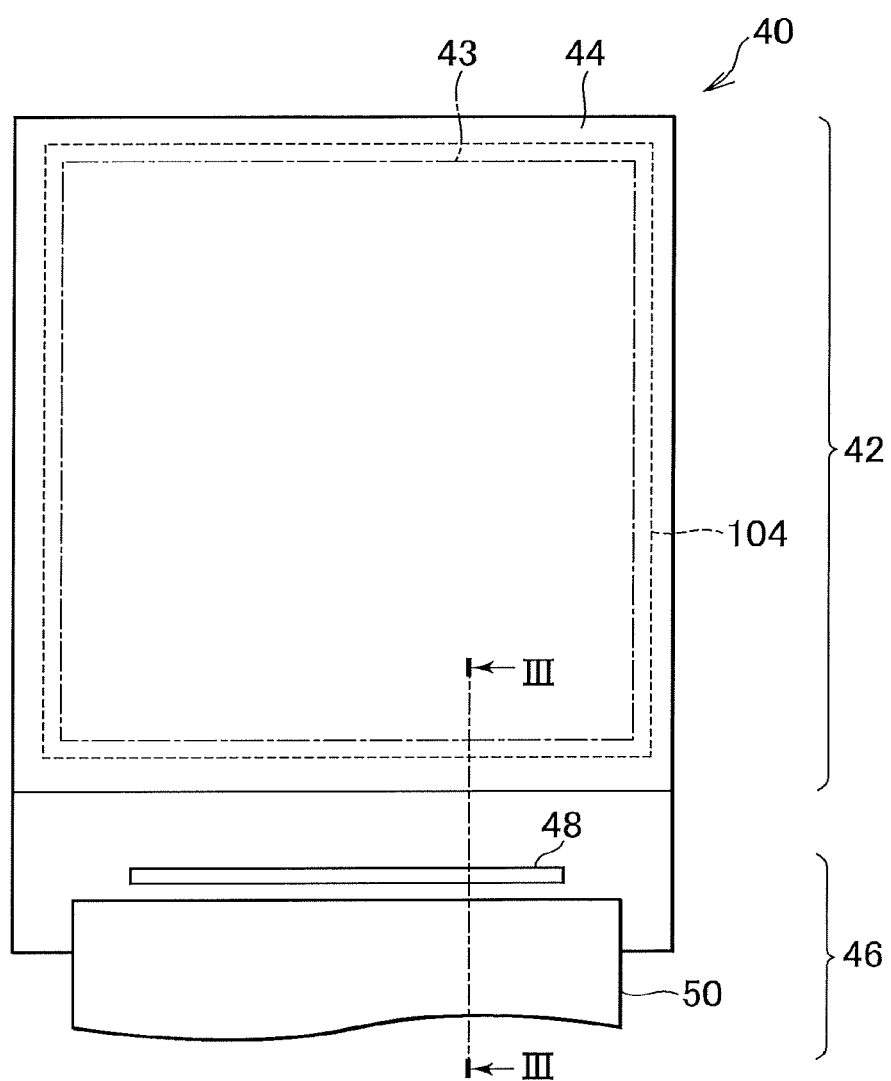
FIG. 2 is a schematic plan view of a display panel of a display device according to the embodiment.

FIG. 2 is a schematic plan view of the display panel 40 of the display device 2. The pixel array unit 4 illustrated in FIG. 1 is arranged in a first area 42 including a display area 43 in which an image is displayed and a frame area 44 surrounding the display area 43, and, as described above, the organic light emitting diodes 6 are arranged in the pixel array unit 4. As described above, the upper electrode layer 104 configuring the organic light emitting diode 6 is formed to be common to the pixels and covers approximately the entire first area 42.

On one side of the display panel 40 having a rectangular shape, a second area 46 in which the driving unit is formed is arranged, and wiring connected to the first area 42 is arranged. In addition, in the second area 46, a driver IC 48 configuring the driving unit is mounted, or a flexible printed circuit (FPC) 50 is connected. The FPC 50 is connected to the scanning line driving circuit 20, the video line driving circuit 22, the driving power supply circuit 24, the control device 26, and the like, and an IC may be mounted thereon.

EXAMPLE 1

Figure 3:
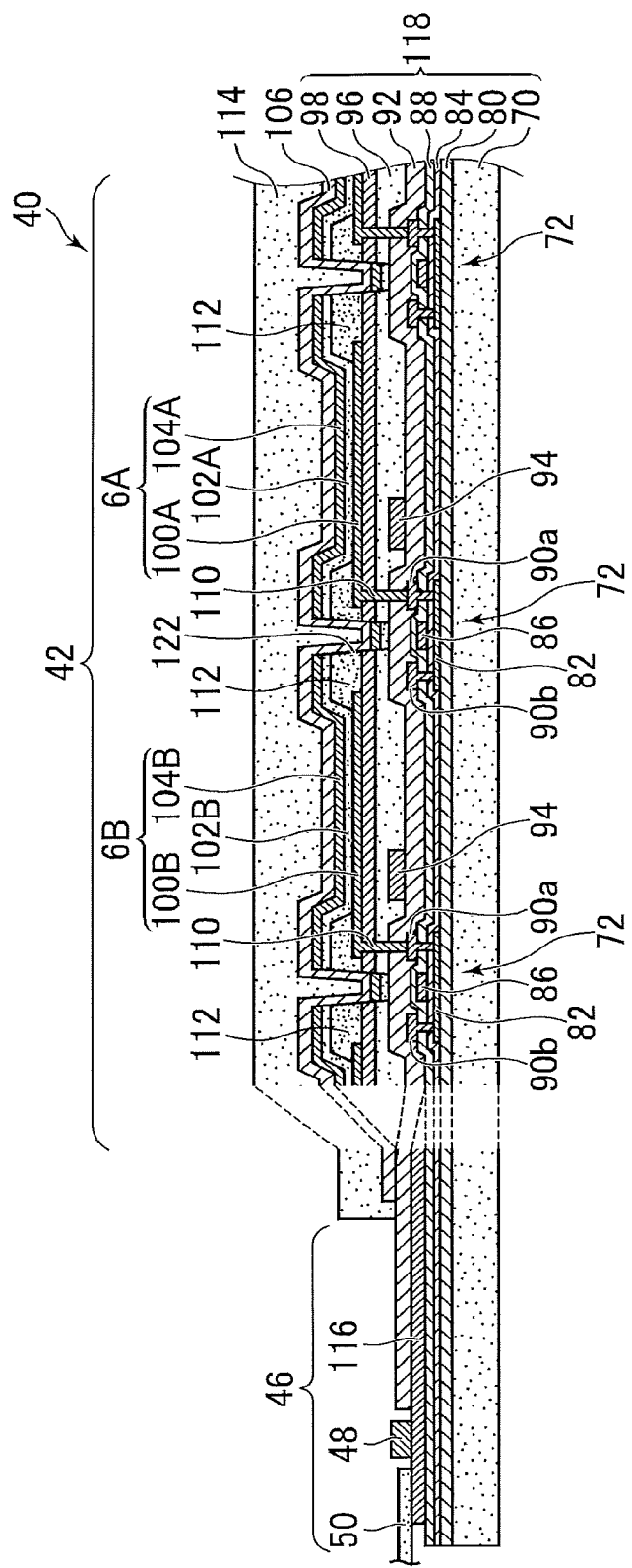
FIG. 3 is a schematic vertical cross-sectional view illustrating a display panel according to Example 1 taken at positions along line III-III illustrated in FIG. 2.

Hereinafter, Example 1 of the embodiment will be described with reference to FIG. 3. FIG. 3 is a schematic vertical cross-sectional view of the display panel 40 taken along line III-III illustrated in FIG. 2. The display panel 40 has a structure including a TFT 72 arranged on an insulating base 70 formed using a resin film, multiple organic light emitting diodes 6 including a first organic light emitting diode 6A, a second organic light emitting diode 6B, and the like, a second inorganic layer 106 as a sealing layer sealing the organic light emitting diodes 6, and the like. As the insulating base 70, glass or the like may be used. In addition, the insulating base 70 may have flexibility and, for example, a resin such as an acryl or polyimide film or the like may be used. On the second inorganic layer 106, a protection film 114 may be formed.

In the embodiment, the pixel array unit 4 is a top-emission type, and light generated by the organic light emitting diode 6 is emitted to a side opposite to the insulating base 70, in other words, toward the upper side in FIG. 3. In addition, in a case in which the coloring system of the display device 2 is a color filter system, color filters are arranged between the second inorganic layer 106 and the protection film 114 or on an opposing substrate side, white light is generated by the organic light emitting diodes 6, and, for example, light of colors such as red (R), green (G), and blue (B) is generated by causing the white light to pass through the color filters.

In a circuit layer of the first area 42, the pixel circuits 8, the scanning signal lines 28, the video signal lines 30, the driving power supply lines 32, and the like described above are formed. In addition, at least a part of the driving unit may be formed in an area adjacent to the first area 42 on the insulating base 70 as a circuit layer. In addition, as described above, the driver IC 48 and the FPC 50 configuring the driving unit may be connected to the wiring 116 of the circuit layer in the second area 46.

Hereinafter, a more specific configuration and a manufacturing method for realizing the configuration will be described. On the insulating base 70, a polysilicon (p-Si) film is formed via a first insulating film 80 as an underlying layer formed from an inorganic insulating material such as silicon nitride ($SiN_y$) or silicon oxide ($SiO_x$), the p-Si film is patterned, and the p-Si film disposed in a place used in the circuit layer is caused to selectively remain. For example, a channel part of the TFT 72 of the top gate type and a semiconductor region 82 to be formed as a source/drain part are formed using the p-Si film. On the channel part of the TFT 72, a gate electrode 86 is arranged via a gate insulating film 84. The gate electrode 86 is formed by patterning a metal film formed through sputtering or the like.

Thereafter, an interlayer insulating film 88 covering the gate electrode 86 is stacked. Impurities are introduced to p-Si to be formed as a source part and a drain part of the TFT 72 through ion injection, and source electrodes 90a and drain electrodes 90b electrically connected thereto are formed. After the TFT 72 is formed in this way, an interlayer insulating film 92 is stacked. On the surface of the interlayer insulating film 92, wiring 94 may be formed by patterning a metal film formed through sputtering or the like. For example, in the metal film and a metal film used for the formation of the gate electrodes 86, the source electrodes 90a, and the drain electrodes 90b, wiring 116 and the scanning signal lines 28, the video signal lines 30, and the driving power supply lines 32 illustrated in FIG. 1 may be formed to have a multi-layer wiring structure. A flattening film 96 is formed, for example, by stacking an organic material such as an acrylic resin thereon.

In this example, on an upper face of this flattening film 96, a first inorganic layer 98 is formed. The first inorganic layer 98 contains silicon nitride, silicon oxide, silicon oxynitride, and the like as composition materials thereof. In this example, an underlying structure layer 118 is configured by the insulating base 70 to the first inorganic layer 98. In addition, another organic or inorganic layer may be arranged in a further upper layer of the first inorganic layer 98, and the underlying structure layer 118 may be up to this another organic or inorganic layer.

On the underlying structure layer 118, a first organic light emitting diode 6A and a second organic light emitting diode 6B are formed. The first organic light emitting diode 6A includes a lower electrode layer 100A, an organic layer 102A, and an upper electrode layer 104A, and the lower electrode layer 100A, the organic layer 102A, and the upper electrode layer 104A are sequentially stacked from the insulating base 70 side. In the embodiment, the lower electrode layer 100A is a positive electrode (anode) of the first organic light emitting diode 6A, and the upper electrode layer 104A is a negative electrode (cathode). The organic layer 102A is configured to include a hole transport layer, alight emitting layer, an electron transport layer, and the like. Similarly, the second organic light emitting diode 6B includes a lower electrode layer 100B, an organic layer 102B, and an upper electrode layer 104B, and the lower electrode layer 100B, the organic layer 102B, and the upper electrode layer 104B are sequentially stacked from the insulating base 70 side. In the embodiment, the lower electrode layer 100B is a positive electrode (anode) of the second organic light emitting diode 6B, and the upper electrode layer 104B is a negative electrode (cathode). The organic layer 102B is configured to include a hole transport layer, alight emitting layer, an electron transport layer, and the like.

In a case in which the TFT 72 illustrated in FIG. 3 is a driving TFT 12 having n-channels, the lower electrode layer 100A of the first organic light emitting diode 6A and the lower electrode layer 100B of the second organic light emitting diode 6B are connected to source electrodes 90a of the TFT 72. More specifically, after the formation of the first inorganic layer 98 described above, contact holes 110 used for connecting the lower electrode layer 100A and the lower electrode layer 100B to the TFT 72 is formed, and a conductor film that is formed on the upper face of the first inorganic layer 98 and inside the contact holes 110 is patterned, whereby the lower electrode layer 100 connected to the TFT 72 can be formed for each pixel.

After the formation of the lower electrode layer 100A and the lower electrode layer 100B, a bank 112 is formed between the first organic light emitting diode 6A and the second organic light emitting diode 6B, in other words, on a pixel boundary. In this example, as the material of the bank 112, a resin such as acryl or polyimide is used. In an effective area of a pixel surrounded by the bank 112, the lower electrode layer 100A and the lower electrode layer 100B are exposed.

After the formation of the bank 112, on the lateral side of the first organic light emitting diode 6A, a first through hole 122 is formed from the upper face of the bank 112 to the upper face of the interlayer insulating film 92. In an inner face of the first through hole 122, the bank 112, the first inorganic layer 98, and the flattening film 96 are exposed. From a bottom face of the first through hole 122, the upper face of the interlayer insulating film 92 is exposed.

Figure 7:
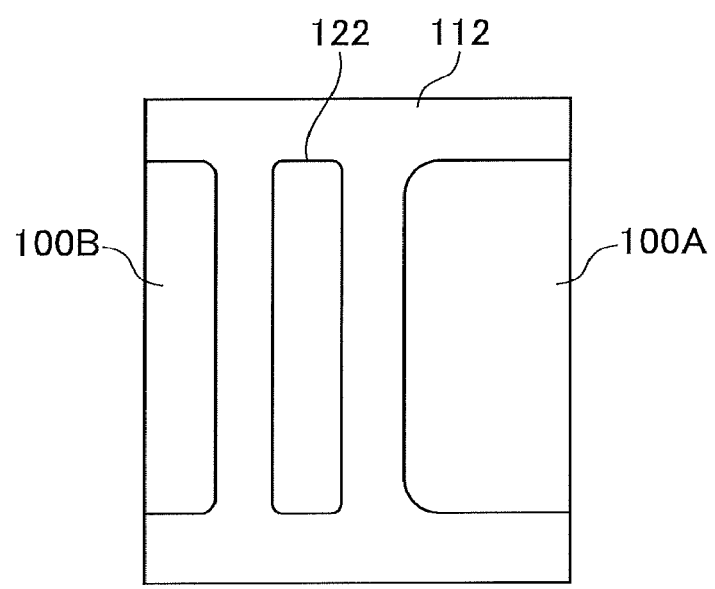
FIG. 7 is a schematic plan view illustrating arrangement relation between a bank and a through hole in a display device according to the embodiment.

As the arrangement and the shape of the first through hole 122, for example, as illustrated in a schematic plan view of FIG. 7, the first through hole 122 is arranged between the lower electrode layer 100A and the lower electrode layer 100B and may have a rectangular shape having a width of a same level as the widths of the lower electrode layer 100A and the lower electrode layer 100B. As a method of forming the first through hole 122, either a dry etching method or a wet etching method may be used.

Figure 8:
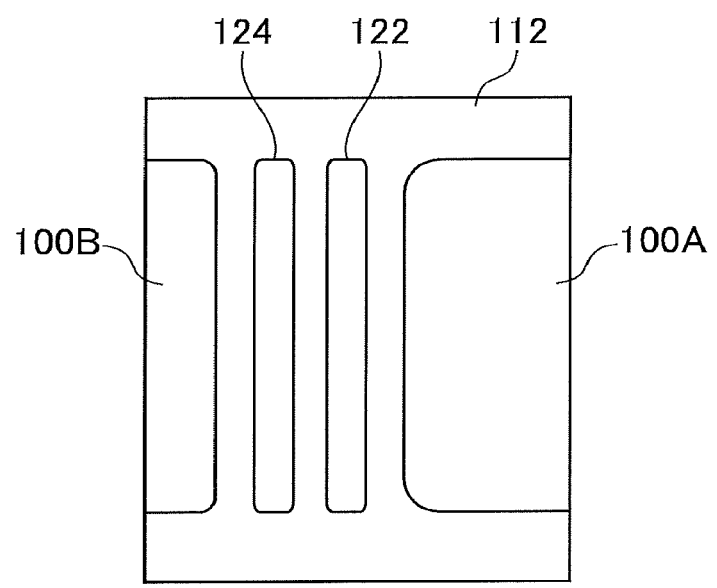
FIG. 8 is a schematic plan view illustrating arrangement relation between a bank and a through hole in a display device according to the embodiment.

The number of through holes arranged in the bank 112 is not limited to one, but multiple through holes may be arranged. For example, as illustrated in a schematic plan view of FIG. 8, a second through hole 124 running in parallel with the first through hole 122 may be arranged between the lower electrode layer 100A and the lower electrode layer 100B.

Figure 9:
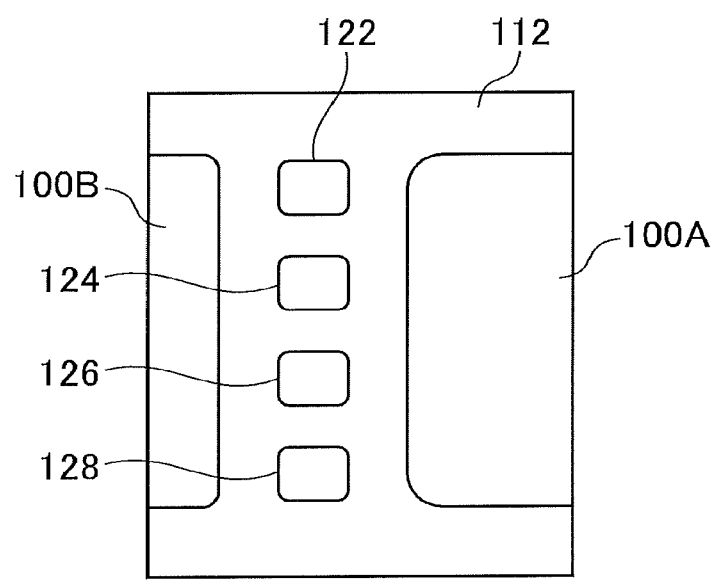
FIG. 9 is a schematic plan view illustrating arrangement relation between a bank and a through hole in a display device according to the embodiment.

Alternatively, as illustrated in a schematic plan view of FIG. 9, a configuration may be employed in which a first through hole 122, a second through hole 124, a third through hole 126, and a fourth through hole 128 having approximately square shapes are arranged at equal spaces between the lower electrode layer 100A and the lower electrode layer 100B.

Figure 10:
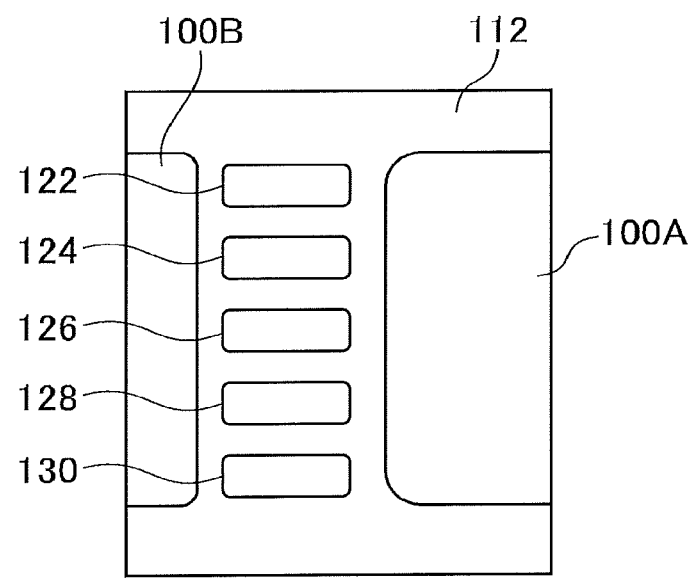
FIG. 10 is a schematic plan view illustrating arrangement relation between a bank and a through hole in a display device according to the embodiment.

Alternatively, as illustrated in a schematic plan view of FIG. 10, a configuration may be employed in which a first through hole 122 having an approximately rectangular shape extending from the lower electrode layer 100A to the lower electrode layer 100B and a second through hole 124, a third through hole 126, a fourth through hole 128, and a fifth through hole 130 running in parallel with the first through hole 122 are formed between the lower electrode layer 100A and the lower electrode layer 100B.

Figure 11:
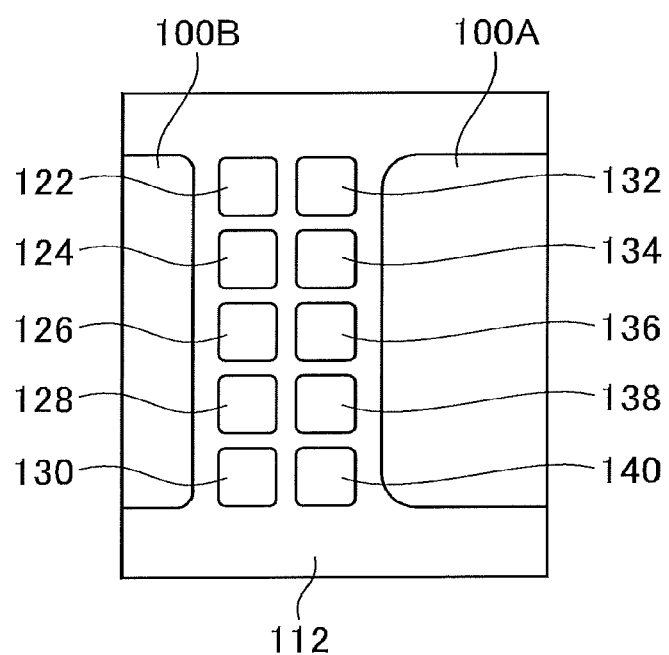
FIG. 11 is a schematic plan view illustrating arrangement relation between a bank and a through hole in a display device according to the embodiment.

Furthermore, as illustrated in a schematic plan view of FIG. 11, a configuration may be employed in which a first through hole 122, a second through hole 124, a third through hole 126, a fourth through hole 128, a fifth through hole 130, a sixth through hole 132, a seventh through hole 134, an eighth through hole 136, a ninth through hole 138, and a tenth through hole 140 having approximately rectangular shapes are formed in a 2×5 matrix pattern between the lower electrode layer 100A and the lower electrode layer 100B.

In this way, while the arrangement and the shape of through holes formed between the lower electrode layer 100A and the lower electrode layer 100B may be appropriately determined in accordance with the shape of the bank 112 and a distance between the lower electrode layer 100A and the lower electrode layer 100B, the adhesiveness between the second inorganic layer 106 and the first inorganic layer 98 can be improved as the surface area of the first inorganic layer 98 exposed from the inner faces of the through holes becomes larger. For this reason, a possibility that peeling-off occurs in a constituent layer inside the organic light emitting diode 6 can be reduced, and, as a result, a possibility that the organic light emitting diode 6 does not emit light can be reduced.

After the formation of the first through hole 122, the second through hole 124, and the like, layers constituting the organic layer 102A are sequentially stacked on the lower electrode layer 100A. Similarly, layers constituting the organic layer 102B are sequentially stacked on the lower electrode layer 100B. Each of the organic layer 102A and the organic layer 102B is formed through vapor deposition and thus is formed with the same thickness as that stacked on the lower electrode layer 100A also in the upper face of the interlayer insulating film 92 exposed at the bottom of the first through hole 122. In addition, in the inner face of the first through hole 122, side faces of the first inorganic layer 98 and the like are exposed.

Thereafter, an upper electrode layer 104A and an upper electrode layer 104B are formed respectively on the organic layer 102A and the organic layer 102B through vapor deposition. The upper electrode layer 104A and the upper electrode layer 104B are formed using a transparent electrode material or the like. The upper electrode layer 104A and the upper electrode layer 104B, similar to the organic layer 102A and the organic layer 102B, are formed through vapor deposition and thus are formed also in the upper faces of the organic layer 102A and the organic layer 102B formed at the bottom of the first through hole 122.

In this way, at the bottom of the first through hole 122, a residual stacking body formed using the same material as that of a stacking body of the organic layer 102A and the upper electrode layer 104A in the first organic light emitting diode 6A is arranged. In addition, in a case in which the second through hole 124 is formed, similarly also in the second through hole 124, at the bottom thereof, a residual stacking body formed using the same material as that of a stacking body of the organic layer 102A and the upper electrode layer 104A in the first organic light emitting diode 6A is arranged.

Figure 13:
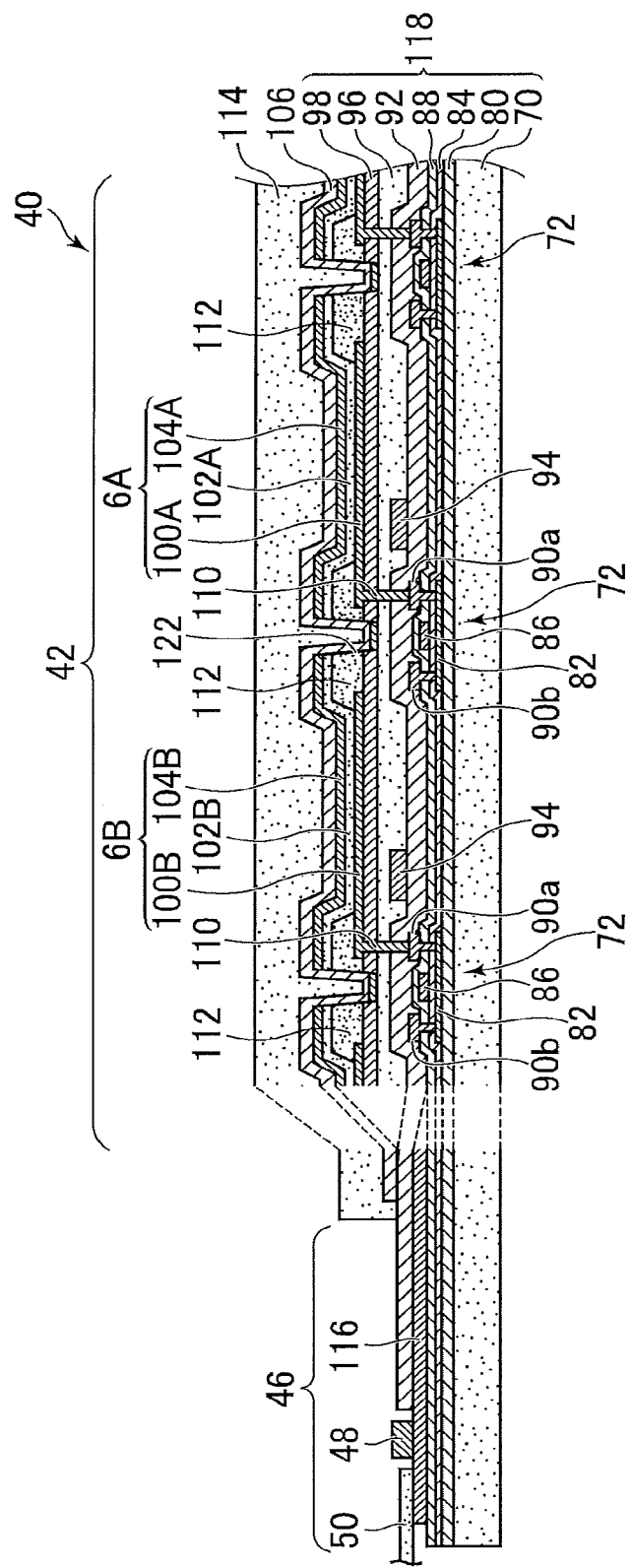
FIG. 13 is a schematic vertical cross-sectional view illustrating a display panel according to Example 1 taken at positions along line III-III illustrated in FIG. 2.

In addition, in this example, a configuration is employed in which the first inorganic layer 98 is exposed on the upper side of the residual stacking body in the inner face of the first through hole 122. In addition, in a case in which the film thickness of the residual stacking body described above is sufficiently smaller than the film thickness of the first inorganic layer 98, as illustrated in FIG. 13, a configuration may be employed in which the first through hole 122 and the like are formed up to the upper face of the flattening film 96, and the first through hole 122 does not pass through the flattening film 96. In addition, in a case in which the second through hole 124 is formed, similar to the first through hole 122, a configuration is employed in which the first inorganic layer 98 is exposed on the upper side of the residual stacking body in the inner face of the second through hole 124.

A second inorganic layer 106 is formed on the upper faces of the upper electrode layer 104A and the upper electrode layer 104B. The second inorganic layer 106 contains silicon nitride, silicon oxide, silicon oxynitride, and the like as composition materials thereof and is formed by forming films of such materials using a CVD method. The second inorganic layer 106 functions as a sealing layer that blocks penetration of impurities such as moistures into the organic light emitting diodes 6. Although not illustrated in the drawing, multiple inorganic insulating layers including the second inorganic layer 106 may be configured as sealing layers, and an organic layer may be included between multiple inorganic insulating layers. In a case in which the organic layer is included, multiple inorganic insulating layers are in contact with each other in an outer periphery of the organic layer in the plan view. This second inorganic layer 106, as illustrated in FIG. 3, is arranged from the upper side of the first organic light emitting diode 6A and the second organic light emitting diode 6B to the inner face of the first through hole 122 and is brought into tight contact with the first inorganic layer 98 exposed from the inner face of the first through hole 122 described above. In addition, in a case in which the second through hole 124 is arranged, the second inorganic layer 106 is arranged up to the inner face of the second through hole 124 and is brought into tight contact with the first inorganic layer 98 exposed from the inner face of the second through hole 124.

According to such a configuration, a configuration can be realized in which the first inorganic layer 98 is exposed in the inner face of the first through hole 122 arranged on the lateral side of the first organic light emitting diode 6A, in other words, between the first organic light emitting diode 6A and the second organic light emitting diode 6B, and the second inorganic layer 106 of which a part is arranged on the upper side of the first organic light emitting diode 6A and the second organic light emitting diode 6B is brought into tight contact with the first inorganic layer 98 in the inner face of the first through hole 122. For this reason, a possibility that peeling-off occurs in a constituent layer inside the first organic light emitting diode 6A and the second organic light emitting diode 6B can be reduced, and a possibility that the first organic light emitting diode 6A and the second organic light emitting diode 6B do not emit light can be reduced.

In addition, in this example illustrated in FIG. 3, a lowest part of a contact face between the first inorganic layer 98 and the second inorganic layer 106 is arranged on a lower side than a position between the upper electrode layer 104A and the organic layer 102A of the first organic light emitting diode 6A. In other words, a structure is formed in which the second inorganic layer 106 that is brought into tight contact with the first inorganic layer 98 is arranged on a lower side than the organic layer 102A, and the first inorganic layer 98 and the second inorganic layer 106 interpose the upper electrode layer 104A and the organic layer 102A therebetween in the vertical direction. For this reason, the occurrence of peeling-off between the upper electrode layer 104A and the organic layer 102A can be further reduced. Similarly, a lowest part of a contact face between the first inorganic layer 98 and the second inorganic layer 106 is arranged on a lower side than a position between the upper electrode layer 104B and the organic layer 102B of the second organic light emitting diode 6B. In other words, a structure is formed in which the second inorganic layer 106 that is brought into tight contact with the first inorganic layer 98 is arranged on a lower side than the organic layer 102B, and the first inorganic layer 98 and the second inorganic layer 106 interpose the upper electrode layer 104B and the organic layer 102B therebetween in the vertical direction. For this reason, the occurrence of peeling-off between the upper electrode layer 104B and the organic layer 102B can be further reduced.

In addition, generally, while the organic layer 102A is configured by multiple layers, in this example illustrated in FIG. 3, a lowest part of a contact face between the first inorganic layer 98 and the second inorganic layer 106 is arranged on a lower side than the organic layer 102A of the first organic light emitting diode 6A. In other words, a structure is formed in which the second inorganic layer 106 that is brought into tight contact with the first inorganic layer 98 is arranged on a lower side than the organic layer 102A, and the first inorganic layer 98 and the second inorganic layer 106 interpose the organic layer 102A therebetween in the vertical direction. For this reason, the occurrence of peeling-off between multiple layers included in the organic layer 102A can be further reduced. Similarly, a lowest part of a contact face between the first inorganic layer 98 and the second inorganic layer 106 is arranged on a lower side than the organic layer 102B of the second organic light emitting diode 6B. In other words, a structure is formed in which the second inorganic layer 106 that is brought into tight contact with the first inorganic layer 98 is arranged on a lower side than the organic layer 102B, and the first inorganic layer 98 and the second inorganic layer interpose the organic layer 102B therebetween in the vertical direction. For this reason, the occurrence of peeling-off between multiple layers included in the organic layer 102B can be further reduced. In addition, in a case in which a lowest part of a contact face between the first inorganic layer 98 and the second inorganic layer 106 is arranged on a lower side than a position between at least two layers included in the organic layer 102A and the organic layer 102B, an effect of further reducing the occurrence of peeling-off between the two layers can be acquired.

Furthermore, in this example illustrated in FIG. 3, a lowest part of a contact face between the first inorganic layer 98 and the second inorganic layer 106 is arranged on a lower side than a position between the organic layer 102A and the lower electrode layer 100A of the first organic light emitting diode 6A. In other words, a structure is formed in which the second inorganic layer 106 that is brought into tight contact with the first inorganic layer 98 is arranged on a lower side than the lower electrode layer 100A, and the first inorganic layer 98 and the second inorganic layer 106 interpose the organic layer 102A and the lower electrode layer 100A therebetween in the vertical direction. For this reason, the occurrence of peeling-off between the organic layer 102A and the lower electrode layer 100A can be further reduced. Similarly, a lowest part of a contact face between the first inorganic layer 98 and the second inorganic layer 106 is arranged on a lower side than a position between the organic layer 102B and the lower electrode layer 100B of the second organic light emitting diode 6B. In other words, a structure is formed in which the second inorganic layer 106 that is brought into tight contact with the first inorganic layer 98 is arranged on a lower side than the lower electrode layer 100B, and the first inorganic layer 98 and the second inorganic layer 106 interpose the organic layer 102B and the lower electrode layer 100B therebetween in the vertical direction. For this reason, the occurrence of peeling-off between the organic layer 102B and the lower electrode layer 100B can be further reduced.

Figure 12:
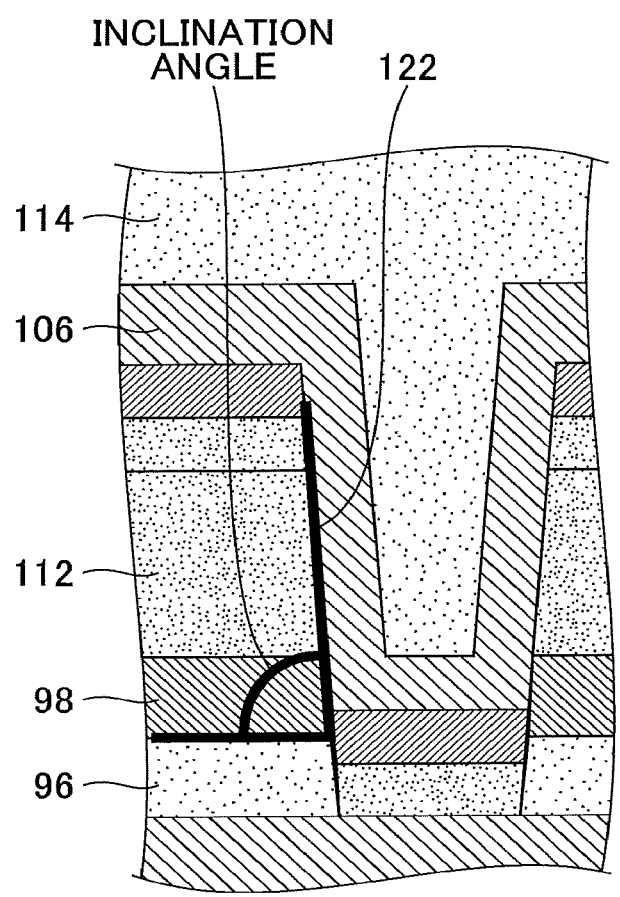
FIG. 12 is a schematic cross-sectional view illustrating an inclination angle of a through hole with respect to a stacking plane of an underlying structure layer in a display device according to the embodiment.

In addition, as illustrated in FIG. 12, it is preferable that at least a part of the inner face of the first through hole 122 should have an inclination angle of 85 degrees or more with respect to the upper face of the flattening film 96. The upper face of the flattening film 96 absorbs unevenness reflecting the stacking structure of each configuration brought into contact with the lower face of the flattening film 96 and, as illustrated in FIG. 3, is parallel to the insulating base 70. A configuration having an inclination angle formed by the upper face of the flattening film 96 and the inner face of the first through hole 122 as being 85 degrees or more is illustrated. By employing such a configuration, in a case in which the organic layer 102A and the upper electrode layer 104A of the first organic light emitting diode 6A are formed using a vapor deposition process, the deposition of the materials of the organic layer 102A and the upper electrode layer 104A in the inner face of the first through hole 122 can be restrained. As a result, the first inorganic layer 98 can be exposed from the inner face. In addition, in a case in which the second through hole 124 is included, similarly, it is preferable that at least a part of the inner face of the second through hole 124 should have an inclination angle of 85 degrees or more with respect to the upper face of the flattening film 96.

After the formation of the second inorganic layer 106, in order to secure mechanical resistance of the surface of the display panel 40, a protection film 114 is stacked. On the other hand, in the second area 46, in order to allow an easy connection of an IC or an FPC, a protection film 114 is not arranged. The wiring of the FPC 50 and the terminal of the driver IC 48, for example, are electrically connected to the wiring 116.

EXAMPLE 2

Figure 4:
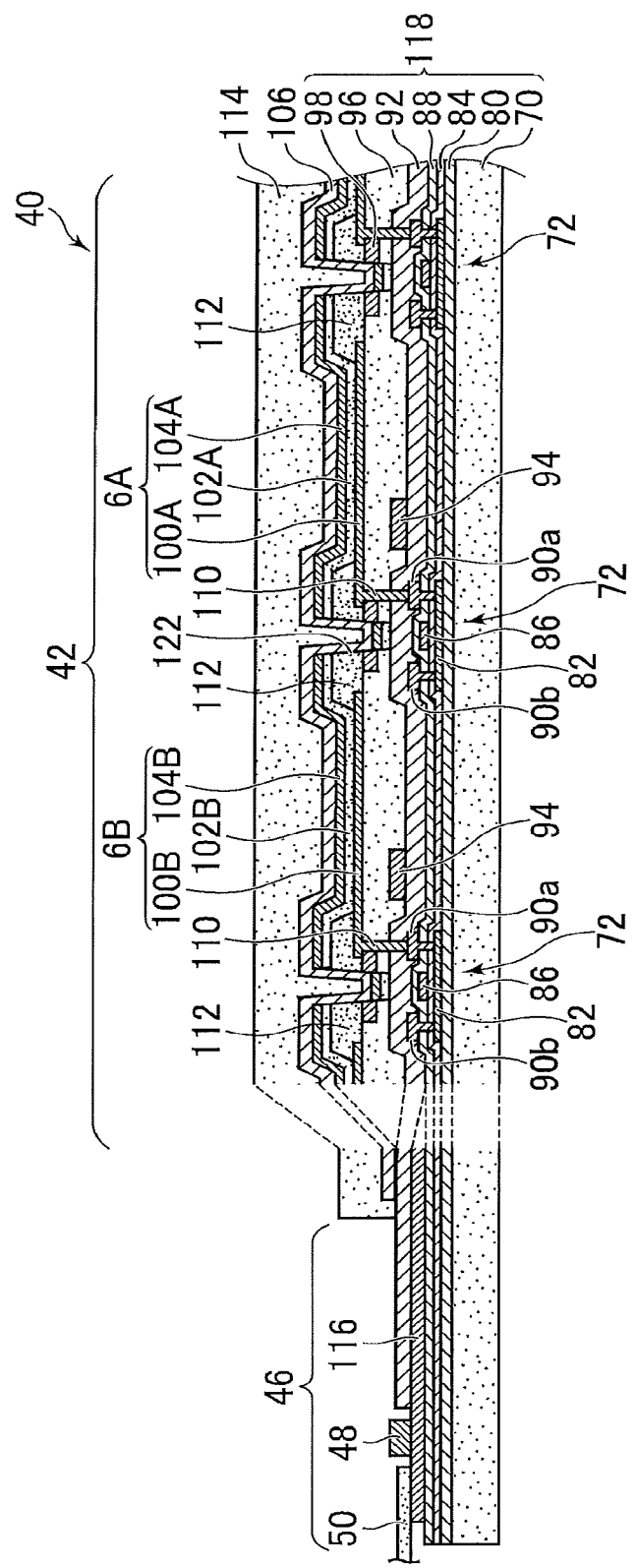
FIG. 4 is a schematic vertical cross-sectional view illustrating a display panel according to Example 2 taken at positions along line III-III illustrated in FIG. 2.

Hereinafter, Example 2 of the embodiment will be described with reference to FIG. 4. The same reference numeral will be assigned to each configuration common to that of Example 1, and description thereof will not be presented. FIG. 4 is a schematic vertical cross-sectional view of a display panel 40 taken along line III-III illustrated in FIG. 2.

In this example, instead of forming a first inorganic layer 98 on the entire upper face of a flattening film 96, the first inorganic layer 98 is configured to be arranged in a part of the inside of the flattening film 96. As the material of the first inorganic layer 98, an inorganic material such as silicon nitride, silicon oxide, or silicon oxynitride is used. An underlying structure layer 118 is configured by an insulating base 70 to the flattening film 96 and the first inorganic layer 98. In addition, another organic or inorganic layer may be arranged in a further upper layer of the flattening film 96 and the first inorganic layer 98, and the underlying structure layer 118 may be up to this another organic or inorganic layer.

Similar to Example 1, after the formation of a bank 112, on the lateral side of a first organic light emitting diode 6A, a first through hole 122 is formed from the upper face of the bank 112 to the upper face of an interlayer insulating film 92. At that time, the first through hole 122 is formed such that the first inorganic layer 98 arranged inside the flattening film 96 is exposed from the inner face of the first through hole 122. For example, by disposing the first through hole 122 such that it passes through the first inorganic layer 98 arranged inside the flattening film 96, the first inorganic layer 98 can be configured to be exposed from the inner face of the first through hole 122.

In a case in which a second through hole 124 is arranged, similar to the first through hole 122, the position of the second through hole 124 is determined such that the first inorganic layer 98 arranged inside the flattening film 96 is exposed from the inner face of the second through hole 124.

In addition, also in this example, at the bottom of the first through hole 122, a residual stacking body formed using the same material as that of a stacking body of an organic layer 102A and an upper electrode layer 104A in the first organic light emitting diode 6A is arranged. In addition, in a case in which the second through hole 124 is formed, similarly also in the second through hole 124, at the bottom thereof, a residual stacking body formed using the same material as that of a stacking body of the organic layer 102A and the upper electrode layer 104A in the first organic light emitting diode 6A is arranged.

Also in this example, a configuration is employed in which the first inorganic layer 98 is exposed on the upper side of the residual stacking body in the inner face of the first through hole 122. In addition, in a case in which the film thickness of the residual stacking body described above is sufficiently smaller than the film thickness of the first inorganic layer 98, a configuration may be employed in which the first through hole 122 and the like are formed up to the upper face of the flattening film 96, and the first through hole 122 does not pass through the flattening film 96. In addition, in a case in which the second through hole 124 is formed, similar to the first through hole 122, a configuration is preferably employed in which the first inorganic layer 98 is exposed on the upper side of the residual stacking body in the inner face of the second through hole 124.

A second inorganic layer 106 is formed on the upper faces of the upper electrode layer 104A and the upper electrode layer 104B. The second inorganic layer 106 is formed by forming films of silicon nitride, silicon oxide, silicon oxynitride, and the like using a CVD method. This second inorganic layer 106, as illustrated in FIG. 4, is arranged from the upper side of the first organic light emitting diode 6A and the second organic light emitting diode 6B to the inner face of the first through hole 122 and is brought into tight contact with the first inorganic layer 98 exposed from the inner face of the first through hole 122 described above. In addition, in a case in which the second through hole 124 is arranged, the second inorganic layer 106 is arranged up to the inner face of the second through hole 124 and is brought into tight contact with the first inorganic layer 98 exposed from the inner face of the second through hole 124.

According to such a configuration, a configuration can be realized in which the first inorganic layer 98 is exposed in the inner face of the first through hole 122 arranged on the lateral side of the first organic light emitting diode 6A, in other words, between the first organic light emitting diode 6A and the second organic light emitting diode 6B, and the second inorganic layer 106 of which a part is arranged on the upper side of the first organic light emitting diode 6A and the second organic light emitting diode 6B is brought into tight contact with the first inorganic layer 98 in the inner face of the first through hole 122. For this reason, a possibility that peeling-off occurs in a constituent layer inside the first organic light emitting diode 6A and the second organic light emitting diode 6B can be reduced, and a possibility that the first organic light emitting diode 6A and the second organic light emitting diode 6B do not emit light can be reduced.

In addition, also in this example illustrated in FIG. 4, a lowest part of a contact face between the first inorganic layer 98 and the second inorganic layer 106 is arranged on a lower side than a position between the upper electrode layer 104A and the organic layer 102A of the first organic light emitting diode 6A. In other words, a structure is formed in which the second inorganic layer 106 that is brought into tight contact with the first inorganic layer 98 is arranged on a lower side than the organic layer 102A, and the first inorganic layer 98 and the second inorganic layer 106 interpose the upper electrode layer 104A and the organic layer 102A therebetween in the vertical direction. For this reason, the occurrence of peeling-off between the upper electrode layer 104A and the organic layer 102A can be further reduced. Similarly, a lowest part of a contact face between the first inorganic layer 98 and the second inorganic layer 106 is arranged on a lower side than a position between the upper electrode layer 104B and the organic layer 102B of the second organic light emitting diode 6B. In other words, a structure is formed in which the second inorganic layer 106 that is brought into tight contact with the first inorganic layer 98 is arranged on a lower side than the organic layer 102B, and the first inorganic layer 98 and the second inorganic layer 106 interpose the upper electrode layer 104B and the organic layer 102B therebetween in the vertical direction. For this reason, the occurrence of peeling-off between the upper electrode layer 104B and the organic layer 102B can be further reduced.

In addition, generally, while the organic layer 102A is configured by multiple layers, also in this example, a lowest part of a contact face between the first inorganic layer 98 and the second inorganic layer 106 is arranged on a lower side than the organic layer 102A of the first organic light emitting diode 6A. In other words, a structure is formed in which the second inorganic layer 106 that is brought into tight contact with the first inorganic layer 98 is arranged on a lower side than the organic layer 102A, and the first inorganic layer 98 and the second inorganic layer 106 interpose the organic layer 102A therebetween in the vertical direction. For this reason, the occurrence of peeling-off between multiple layers included in the organic layer 102A can be further reduced. Similarly, a lowest part of a contact face between the first inorganic layer 98 and the second inorganic layer 106 is arranged on a lower side than the organic layer 102B of the second organic light emitting diode 6B. In other words, a structure is formed in which the second inorganic layer 106 that is brought into tight contact with the first inorganic layer 98 is arranged on a lower side than the organic layer 102B, and the first inorganic layer 98 and the second inorganic layer 106 interpose the organic layer 102B therebetween in the vertical direction. For this reason, the occurrence of peeling-off between multiple layers included in the organic layer 102B can be further reduced. In addition, in a case in which a lowest part of a contact face between the first inorganic layer 98 and the second inorganic layer 106 is arranged on a lower side than a position between at least two layers included in the organic layer 102A and the organic layer 102B, an effect of further reducing the occurrence of peeling-off between the two layers can be acquired.

Furthermore, a lowest part of a contact face between the first inorganic layer 98 and the second inorganic layer 106 is arranged on a lower side than a position between the organic layer 102A and the lower electrode layer 100A of the first organic light emitting diode 6A. In other words, a structure is formed in which the second inorganic layer 106 that is brought into tight contact with the first inorganic layer 98 is arranged on a lower side than the lower electrode layer 100A, and the first inorganic layer 98 and the second inorganic layer 106 interpose the organic layer 102A and the lower electrode layer 100A therebetween in the vertical direction. For this reason, the occurrence of peeling-off between the organic layer 102A and the lower electrode layer 100A can be further reduced. Similarly, a lowest part of a contact face between the first inorganic layer 98 and the second inorganic layer 106 is arranged on a lower side than a position between the organic layer 102B and the lower electrode layer 100B of the second organic light emitting diode 6B. In other words, a structure is formed in which the second inorganic layer 106 that is brought into tight contact with the first inorganic layer 98 is arranged on a lower side than the lower electrode layer 100B, and the first inorganic layer 98 and the second inorganic layer 106 interpose the organic layer 102B and the lower electrode layer 100B therebetween in the vertical direction. For this reason, the occurrence of peeling-off between the organic layer 102B and the lower electrode layer 100B can be further reduced.

In addition, it is preferable that at least a part of the inner face of the first through hole 122 should have an inclination angle of 85 degrees or more with respect to the upper face of the flattening film 96, which is similar to Example 1 described above, and thus, description thereof will not be presented.

EXAMPLE 3

Figure 5:
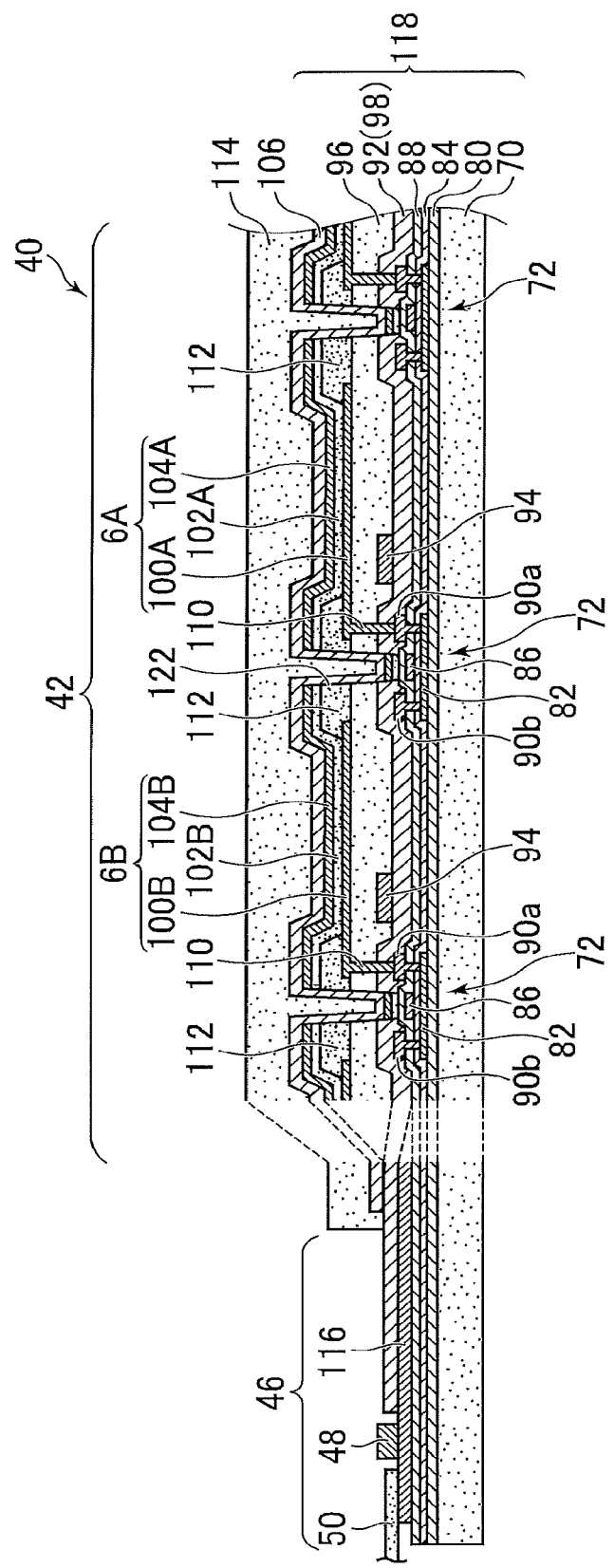
FIG. 5 is a schematic vertical cross-sectional view illustrating a display panel according to Example 3 taken at positions along line III-III illustrated in FIG. 2.

Hereinafter, Example 3 of the embodiment will be described with reference to FIG. 5. The same reference numeral will be assigned to each configuration common to that of Example 1, and description thereof will not be presented. FIG. 5 is a schematic vertical cross-sectional view of a display panel 40 taken along line III-III illustrated in FIG. 2.

In this example, instead of forming a first inorganic layer 98 on the upper face of a flattening film 96, an interlayer insulating film 92 is used as a first inorganic layer 98. As the material of the interlayer insulating film 92, that is, the first inorganic layer 98, an inorganic material such as silicon nitride, silicon oxide, or silicon oxynitride is used. In this example, an underlying structure layer 118 is configured by an insulating base 70 to the flattening film 96. In addition, another organic or inorganic layer may be arranged in a further upper layer of the flattening film 96, and the underlying structure layer 118 may be up to this another organic or inorganic layer.

In this example, after the formation of a bank 112, on the lateral side of a first organic light emitting diode 6A, a first through hole 122 is formed from the upper face of the bank 112 to the upper face of an interlayer insulating film 88. At that time, the first through hole 122 is formed such that the interlayer insulating film 92, that is, the first inorganic layer 98 is exposed from the inner face of the first through hole 122.

In a case in which a second through hole 124 is arranged, similar to the first through hole 122, the second through hole 124 is formed such that the first inorganic layer 98 is exposed from the inner face of the second through hole 124.

In addition, also in this example, at the bottom of the first through hole 122, a residual stacking body formed using the same material as that of a stacking body of an organic layer 102A and an upper electrode layer 104A in the first organic light emitting diode 6A is arranged. In addition, in a case in which the second through hole 124 is formed, similarly also in the second through hole 124, at the bottom thereof, a residual stacking body formed using the same material as that of a stacking body of the organic layer 102A and the upper electrode layer 104A in the first organic light emitting diode 6A is arranged.

Also in this example, a configuration is employed in which the first inorganic layer 98 is exposed on the upper side of the residual stacking body in the inner face of the first through hole 122. In addition, in a case in which the second through hole 124 is formed, similar to the first through hole 122, a configuration is employed in which the first inorganic layer 98 is exposed on the upper side of the residual stacking body in the inner face of the second through hole 124.

A second inorganic layer 106 is formed on the upper faces of the upper electrode layer 104A and the upper electrode layer 104B. The second inorganic layer 106 is formed by forming layers of silicon nitride, silicon oxide, silicon oxynitride, and the like using a CVD method. This second inorganic layer 106, as illustrated in FIG. 5, is arranged from the upper side of the first organic light emitting diode 6A and the second organic light emitting diode 6B to the inner face of the first through hole 122 and is brought into tight contact with the first inorganic layer 98 exposed from the inner face of the first through hole 122 described above. In addition, in a case in which the second through hole 124 is arranged, the second inorganic layer 106 is arranged up to the inner face of the second through hole 124 and is brought into tight contact with the first inorganic layer 98 exposed from the inner face of the second through hole 124.

According to such a configuration, a configuration can be realized in which the first inorganic layer 98 is exposed in the inner face of the first through hole 122 arranged on the lateral side of the first organic light emitting diode 6A, in other words, between the first organic light emitting diode 6A and the second organic light emitting diode 6B, and the second inorganic layer 106 of which a part is arranged on the upper side of the first organic light emitting diode 6A and the second organic light emitting diode 6B is brought into tight contact with the first inorganic layer 98 in the inner face of the first through hole 122. For this reason, a possibility that peeling-off occurs in a constituent layer inside the first organic light emitting diode 6A and the second organic light emitting diode 6B can be reduced, and a possibility that the first organic light emitting diode 6A and the second organic light emitting diode 6B do not emit light can be reduced.

In addition, also in this example illustrated in FIG. 5, a lowest part of a contact face between the first inorganic layer 98 and the second inorganic layer 106 is arranged on a lower side than a position between the upper electrode layer 104A and the organic layer 102A of the first organic light emitting diode 6A. In other words, a structure is formed in which the second inorganic layer 106 that is brought into tight contact with the first inorganic layer 98 is arranged on a lower side than the organic layer 102A, and the first inorganic layer 98 and the second inorganic layer 106 interpose the upper electrode layer 104A and the organic layer 102A therebetween in the vertical direction. For this reason, the occurrence of peeling-off between the upper electrode layer 104A and the organic layer 102A can be further reduced. Similarly, a lowest part of a contact face between the first inorganic layer 98 and the second inorganic layer 106 is arranged on a lower side than a posit ion between the upper electrode layer 104B and the organic layer 102B of the second organic light emitting diode 6B. In other words, a structure is formed in which the second inorganic layer 106 that is brought into tight contact with the first inorganic layer 98 is arranged on a lower side than the organic layer 102B, and the first inorganic layer 98 and the second inorganic layer 106 interpose the upper electrode layer 104B and the organic layer 102B therebetween in the vertical direction. For this reason, the occurrence of peeling-off between the upper electrode layer 104B and the organic layer 102B can be further reduced.

In addition, generally, while the organic layer 102A is configured by multiple layers, also in this example, a lowest part of a contact face between the first inorganic layer 98 and the second inorganic layer 106 is arranged on a lower side than the organic layer 102A of the first organic light emitting diode 6A. In other words, a structure is formed in which the second inorganic layer 106 that is brought into tight contact with the first inorganic layer 98 is arranged on a lower side than the organic layer 102A, and the first inorganic layer 98 and the second inorganic layer 106 interpose the organic layer 102A therebetween in the vertical direction. For this reason, the occurrence of peeling-off between multiple layers included in the organic layer 102A can be further reduced. Similarly, a lowest part of a contact face between the first inorganic layer 98 and the second inorganic layer 106 is arranged on a lower side than the organic layer 102B of the second organic light emitting diode 6B. In other words, a structure is formed in which the second inorganic layer 106 that is brought into tight contact with the first inorganic layer 98 is arranged on a lower side than the organic layer 102B, and the first inorganic layer 98 and the second inorganic layer 106 interpose the organic layer 102B therebetween in the vertical direction. For this reason, the occurrence of peeling-off between multiple layers included in the organic layer 102B can be further reduced. In addition, in a case in which a lowest part of a contact face between the first inorganic layer 98 and the second inorganic layer 106 is arranged on a lower side than a position between at least two layers included in the organic layer 102A and the organic layer 102B, an effect of further reducing the occurrence of peeling-off between the two layers can be acquired.

Furthermore, a lowest part of a contact face between the first inorganic layer 98 and the second inorganic layer 106 is arranged on a lower side than a position between the organic layer 102A and the lower electrode layer 100A of the first organic light emitting diode 6A. In other words, a structure is formed in which the second inorganic layer 106 that is brought into tight contact with the first inorganic layer 98 is arranged on a lower side than the lower electrode layer 100A, and the first inorganic layer 98 and the second inorganic layer 106 interpose the organic layer 102A and the lower electrode layer 100A therebetween in the vertical direction. For this reason, the occurrence of peeling-off between the organic layer 102A and the lower electrode layer 100A can be further reduced. Similarly, a lowest part of a contact face between the first inorganic layer 98 and the second inorganic layer 106 is arranged on a lower side than a position between the organic layer 102B and the lower electrode layer 100B of the second organic light emitting diode 6B. In other words, a structure is formed in which the second inorganic layer 106 that is brought into tight contact with the first inorganic layer 98 is arranged on a lower side than the lower electrode layer 100B, and the first inorganic layer 98 and the second inorganic layer 106 interpose the organic layer 102B and the lower electrode layer 100B therebetween in the vertical direction. For this reason, the occurrence of peeling-off between the organic layer 102B and the lower electrode layer 100B can be further reduced.

In addition, it is preferable that at least a part of the inner face of the first through hole 122 should have an inclination angle of 85 degrees or more with respect to the upper face of the flattening film 96, which is similar to Example 1 described above, and thus, description thereof will not be presented.

EXAMPLE 4

Figure 6:
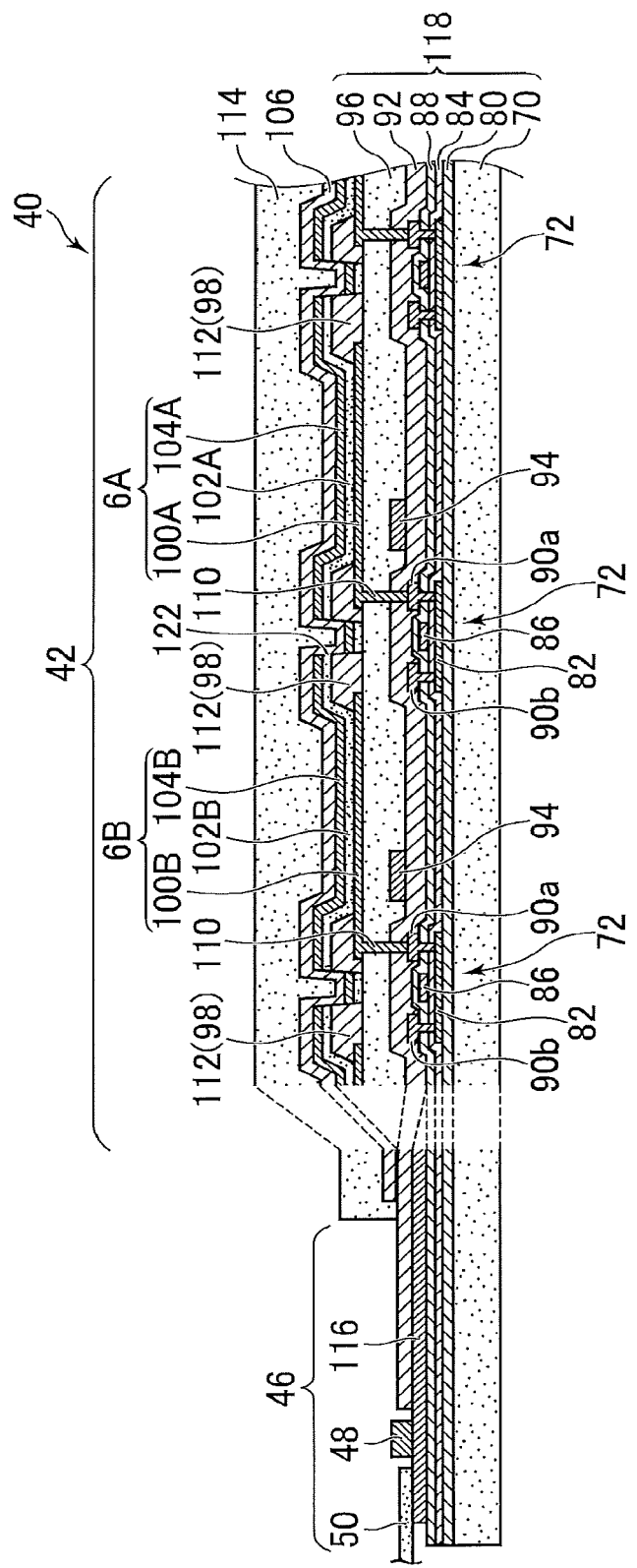
FIG. 6 is a schematic vertical cross-sectional view illustrating a display panel according to Example 4 taken at positions along line III-III illustrated in FIG. 2.

Hereinafter, Example 4 of the embodiment will be described with reference to FIG. 6. The same reference numeral will be assigned to each configuration common to that of Example 1, and description thereof will not be presented. FIG. 6 is a schematic vertical cross-sectional view of a display panel 40 taken along line III-III illustrated in FIG. 2.

In this example, instead of forming a first inorganic layer 98 on the upper face of a flattening film 96, a bank 112 is used as the first inorganic layer 98. As the material of the bank 112, that is, the first inorganic layer 98, an inorganic material such as silicon nitride, silicon oxide, or silicon oxynitride is used.

In this example, an underlying structure layer 118 is configured by an insulating base 70 to the flattening layer 96. In addition, another organic or inorganic layer may be arranged in a further upper layer of the flattening film 96, and the underlying structure layer 118 may be up to this another organic or inorganic layer.

In this example, after the formation of the bank 112 that is the first inorganic layer 98, on the lateral side of the first organic light emitting diode 6A, a first through hole 122 is formed from the upper face of the bank 112 to the upper face of the flattening layer 96. At that time, the first inorganic layer 98 is exposed from an inner face of the first through hole 122.

In a case in which a second through hole 124 is arranged, similar to the first through hole 122, the first inorganic layer 98 is exposed from the inner face of the second through hole 124.

In addition, also in this example, at the bottom of the first through hole 122, a residual stacking body formed using the same material as that of a stacking body of an organic layer 102A and an upper electrode layer 104A in the first organic light emitting diode 6A is arranged. In addition, in a case in which the second through hole 124 is formed, similarly also in the second through hole 124, at the bottom thereof, a residual stacking body formed using the same material as that of a stacking body of the organic layer 102A and the upper electrode layer 104A in the first organic light emitting diode 6A is arranged.

Also in this example, a configuration is employed in which the first inorganic layer 98 is exposed on the upper side of the residual stacking body in the inner face of the first through hole 122. In addition, in a case in which the second through hole 124 is formed, similar to the first through hole 122, a configuration is employed in which the bank 112, that is, the first inorganic layer 98 is exposed on the upper side of the residual stacking body in the inner face of the second through hole 124.

A second inorganic layer 106 is formed on the upper faces of the upper electrode layer 104A and the upper electrode layer 104B. The second inorganic layer 106 is formed by forming films of silicon nitride, silicon oxide, silicon oxynitride, and the like using a CVD method. This second inorganic layer 106, as illustrated in FIG. 6, is arranged from the upper side of the first organic light emitting diode 6A and the second organic light emitting diode 6B to the inner face of the first through hole 122 and is brought into tight contact with the first inorganic layer 98 exposed from the inner face of the first through hole 122 described above. In addition, in a case in which the second through hole 124 is arranged, the second inorganic layer 106 is arranged up to the inner face of the second through hole 124 and is brought into tight contact with the first inorganic layer 98 exposed from the inner face of the second through hole 124.

According to such a configuration, a configuration can be realized in which the first inorganic layer 98 is exposed in the inner face of the first through hole 122 arranged on the lateral side of the first organic light emitting diode 6A, in other words, between the first organic light emitting diode 6A and the second organic light emitting diode 6B, and the second inorganic layer 106 of which a part is arranged on the upper side of the first organic light emitting diode 6A and the second organic light emitting diode 6B is brought into tight contact with the first inorganic layer 98 in the inner face of the first through hole 122. For this reason, a possibility that peeling-off occurs in a constituent layer inside the first organic light emitting diode 6A and the second organic light emitting diode 6B can be reduced, and a possibility that the first organic light emitting diode 6A and the second organic light emitting diode 6B do not emit light can be reduced.

In addition, also in this example illustrated in FIG. 6, a lowest part of a contact face between the first inorganic layer 98 and the second inorganic layer 106 is preferably configured to be arranged on a lower side than a position between the upper electrode layer 104A and the organic layer 102A of the first organic light emitting diode 6A. In other words, a structure is formed in which the second inorganic layer 106 that is brought into tight contact with the first inorganic layer 98 is arranged on a lower side than the organic layer 102A, and the first inorganic layer 98 and the second inorganic layer 106 interpose the upper electrode layer 104A and the organic layer 102A therebetween in the vertical direction. By employing such a configuration, the occurrence of peeling-off between the upper electrode layer 104A and the organic layer 102A can be further reduced. Similarly, a lowest part of a contact face between the first inorganic layer 98 and the second inorganic layer 106 is configured to be arranged on a lower side than a position between the upper electrode layer 104B and the organic layer 102B of the second organic light emitting diode 6B. In other words, a structure is formed in which the second inorganic layer 106 that is brought into tight contact with the first inorganic layer 98 is arranged on a lower side than the organic layer 102A, and the first inorganic layer 98 and the second inorganic layer 106 interpose the upper electrode layer 104B and the organic layer 102B therebetween in the vertical direction. According to such a configuration, the occurrence of peeling-off between the upper electrode layer 104B and the organic layer 102B can be further reduced, which is preferable.

In addition, in the configuration illustrated in FIG. 6, a lowest part of a contact face between the first inorganic layer 98 and the second inorganic layer 106 is configured to be arranged on a lower side than the organic layer 102A of the first organic light emitting diode 6A. In other words, a structure is formed in which the second inorganic layer 106 that is brought into tight contact with the first inorganic layer 98 is arranged on a lower side than the organic layer 102A, and the first inorganic layer 98 and the second inorganic layer 106 interpose the organic layer 102A therebetween in the vertical direction. By employing such a configuration, the occurrence of peeling-off between multiple layers included in the organic layer 102A can be further reduced. Similarly, a lowest part of a contact face between the first inorganic layer 98 and the second inorganic layer 106 is configured to be arranged on a lower side than the organic layer 102B of the second organic light emitting diode 6B. In other words, a structure is formed in which the second inorganic layer 106 that is brought into tight contact with the first inorganic layer 98 is arranged on a lower side than the organic layer 102B, and the first inorganic layer 98 and the second inorganic layer 106 interpose the organic layer 102B therebetween in the vertical direction. By employing such a configuration, the occurrence of peeling-off between multiple layers included in the organic layer 102B can be further reduced, which is preferable. In addition, in a case in which a lowest part of a contact face between the first inorganic layer 98 and the second inorganic layer 106 is arranged on a lower side than a position between at least two layers included in the organic layer 102A and the organic layer 102B, an effect of further reducing the occurrence of peeling-off between the two layers can be acquired.

Furthermore, in the configuration illustrated in FIG. 6, a configuration in which a lowest part of a contact face between the first inorganic layer 98 and the second inorganic layer 106 is arranged on a lower side than a position between the organic layer 102A and the lower electrode layer 100A of the first organic light emitting diode 6A is not employed. However, by configuring the first through hole 122 to be arranged up to the inside of the flattening layer 96 or the inside of the interlayer insulating film 92, a configuration is preferable in which a lowest part of a contact face between the first inorganic layer 98 and the second inorganic layer 106 is arranged on a lower side than a position between the organic layer 102A and the lower electrode layer 100A of the first organic light emitting diode 6A. The reason for this is that, by employing such a configuration, the occurrence of peeling-off between the organic layer 102A and the lower electrode layer 100A can be further reduced. At the same time, by employing a configuration in which a lowest part of a contact face between the first inorganic layer 98 and the second inorganic layer 106 is arranged on a lower side than a position between the organic layer 102B and the lower electrode layer 100B of the second organic light emitting diode 6B, the occurrence of peeling-off between the organic layer 102B and the lower electrode layer 100B can be further reduced, which is preferable.

In addition, in the example illustrated in FIG. 6, although an example in which the entire bank 112 is the first inorganic layer 98 is illustrated, a part of the bank 112 may be configured as the first inorganic layer 98. In a case in which only a part of the bank 112 is configured as the first inorganic layer 98, it is necessary to employ a configuration in which the first through hole 122 passes through a first inorganic layer 98 forming part, and the first inorganic layer 98 is exposed from the inner face of the first through hole 122.

In addition, also in the configuration in which only a part of the bank 112 is configured as the first inorganic layer 98, in consideration of the presence of the residual stacking body described above, even when the residual stacking body is formed at the bottom of the first through hole 122 and the second through hole 124, it is necessary to configure the first inorganic layer 98 to be exposed from the inner faces of the first through hole 122 and the second through hole 124.

In the configuration in which only a part of the bank 112 is configured as the first inorganic layer 98, it is preferable to employ a configuration in which a lowest part of the first inorganic layer 98 forming part in the bank 112 is arranged on a lower side than a position between the upper electrode layer 104A and the organic layer 102A of the first organic light emitting diode 6A, and a lowest part of a contact face between the first inorganic layer 98 and the second inorganic layer 106 is arranged on a lower side than a position between the upper electrode layer 104A and the organic layer 102A of the first organic light emitting diode 6A. In other words, a structure is preferable in which the second inorganic layer 106 brought into tight contact with the first inorganic layer 98 is arranged on a lower side than the organic layer 102A, and the first inorganic layer 98 and the second inorganic layer 106 interpose the upper electrode layer 104A and the organic layer 102A therebetween in the vertical direction. By employing such a configuration, the occurrence of peeling-off between the upper electrode layer 104A and the organic layer 102A can be further reduced. Similarly, it is preferable to employ a configuration in which a lowest part of the first inorganic layer 98 forming part in the bank 112 is arranged on a lower side than a position between the upper electrode layer 104B and the organic layer 102B of the second organic light emitting diode 6B. In other words, a structure is preferable in which the second inorganic layer 106 brought into tight contact with the first inorganic layer 98 is arranged on a lower side than the organic layer 102B, and the first inorganic layer 98 and the second inorganic layer 106 interpose the upper electrode layer 104B and the organic layer 102B therebetween in the vertical direction. By employing such a configuration, the occurrence of peeling-off between the upper electrode layer 104B and the organic layer 102B can be further reduced, which is preferable.

Furthermore, a configuration is employed in which a lowest part of the first inorganic layer 98 forming part in the bank 112 is arranged on a lower side than the organic layer 102A of the first organic light emitting diode 6A, and a lowest part of a contact face between the first inorganic layer 98 and the second inorganic layer 106 is arranged on a lower side than the organic layer 102A of the first organic light emitting diode 6A. In other words, a structure is employed in which the second inorganic layer 106 brought into tight contact with the first inorganic layer 98 is arranged on a lower side than the organic layer 102A, and the first inorganic layer 98 and the second inorganic layer 106 interpose the organic layer 102A therebetween in the vertical direction. By employing such a configuration, the occurrence of peeling-off between multiple layers included in the organic layer 102A can be further reduced, which is preferable. Similarly, a lowest part of a contact face between the first inorganic layer 98 and the second inorganic layer 106 in the bank 112 is arranged on a lower side than the organic layer 102B of the second organic light emitting diode 6B. In other words, a structure is employed in which the second inorganic layer 106 brought into tight contact with the first inorganic layer 98 is arranged on a lower side than the organic layer 102B, and the first inorganic layer 98 and the second inorganic layer 106 interpose the organic layer 102B therebetween in the vertical direction. Accordingly, the occurrence of peeling-off between multiple layers included in the organic layer 102B can be further reduced, which is preferable.

In addition, in order to implement such a configuration, for example, by forming the first through hole 122 up to the inside of the flattening layer 96 or the inside of the interlayer insulating film 92, a configuration in which a lowest part of a contact face between the first inorganic layer 98 and the second inorganic layer 106 is arranged on a lower side than the organic layer 102A and the organic layer 102B may be employed.

In addition, in a case in which a lowest part of a contact face between the first inorganic layer 98 and the second inorganic layer 106 is arranged on a lower side than a position between at least two layers included in the organic layer 102A and the organic layer 102B, an effect of further reducing the occurrence of peeling-off between the two layers can be acquired.

Furthermore, a configuration is preferable in which a lowest part of the first inorganic layer 98 forming part in the bank 112 is arranged on a lower side than a position between the organic layer 102A and the lower electrode layer 100A of the first organic light emitting diode 6A, and a lowest part of a contact face between the first inorganic layer 98 and the second inorganic layer 106 is arranged on a lower side than a position between the organic layer 102A and the lower electrode layer 100A of the first organic light emitting diode 6A. In other words, a structure is preferable in which the second inorganic layer 106 that is brought into tight contact with the first inorganic layer 98 is arranged on a lower side than the lower electrode layer 100A, and the first inorganic layer 98 and the second inorganic layer 106 interpose the organic layer 102A and the lower electrode layer 100A therebetween in the vertical direction. By employing such a configuration, the occurrence of peeling-off between the organic layer 102A and the lower electrode layer 100A can be further reduced, which is preferable. Similarly, a configuration is employed in which a lowest part of a contact face between the first inorganic layer 98 and the second inorganic layer 106 in the bank 112 is arranged on a lower side than a position between the organic layer 102B and the lower electrode layer 100B of the second organic light emitting diode 6B. In other words, a structure is employed in which the second inorganic layer 106 brought into tight contact with the first inorganic layer 98 is arranged on a lower side than the lower electrode layer 100B, and the first inorganic layer 98 and the second inorganic layer 106 interpose the organic layer 102B and the lower electrode layer 100B therebetween in the vertical direction. By employing such a configuration, the occurrence of peeling-off between the organic layer 102B and the lower electrode layer 100B can be further reduced, which is preferable.

In addition, in order to implement such a configuration, for example, by forming the first through hole 122 up to the inside of the flattening layer 96 or the inside of the interlayer insulating film 92, a configuration in which a lowest part of a contact face between the first inorganic layer 98 and the second inorganic layer 106 is arranged on a lower side than a position between the organic layer 102A and the lower electrode layer 100A and a position between the organic layer 102B and the lower electrode layer 100B.

In addition, it is preferable that at least a part of the inner face of the first through hole 122 should have an inclination angle of 85 degrees or more with respect to the upper face of the flattening layer 96, which is similar to Example 1 described above, and thus, description thereof will not be presented.

EXAMPLE 5

In Examples 1 to 4 described above, although an example in which the through hole is formed in the display area 43 has been described, a configuration may be employed in which a through hole is formed in the frame area 44 illustrated in FIG. 2, and the first inorganic layer 98 and the second inorganic layer 106 are brought into tight contact with each other using the through hole formed in the frame area 44.

Figure 14:
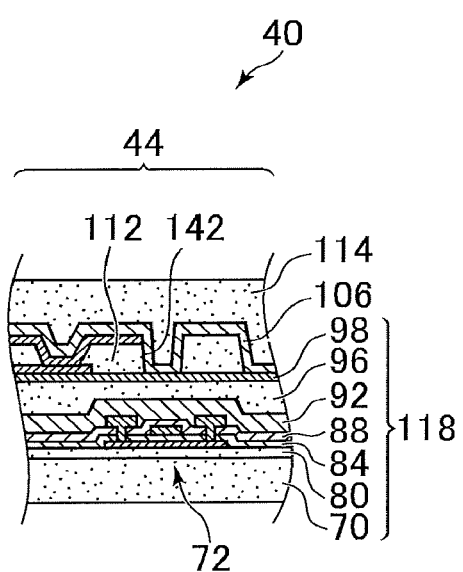
FIG. 14 is a schematic vertical cross-sectional view illustrating a frame area in a display device according to the embodiment.

FIG. 14 is a schematic vertical cross-sectional view illustrating a frame area in the display device according to the embodiment. As illustrated in FIG. 14, an eleventh through hole 142 is formed from the upper face of the bank 112 to the upper face of the first inorganic layer 98 in the frame area 44. The upper face of the first inorganic layer 98 is exposed from the bottom of the eleventh through hole 142. In addition, the lower end of the eleventh through hole 142 is not limited to the upper face of the first inorganic layer 98 but may be inside the first inorganic layer 98.

In addition, the number of through holes formed in the bank 112 is not limited to one, and multiple through holes may be formed.

In this way, also in the frame area 44, by forming the eleventh through hole 142 from the upper face of the bank 112 to the upper face of the first inorganic layer 98, the second inorganic layer 106 arranged from the upper side of the bank 112 to the inside of the eleventh through hole 142 and the first inorganic layer 98 exposed from a part of the eleventh through hole 142 can be brought into tight contact with each other. For this reason, in the whole display panel 40, a possibility of the occurrence of peeling-off in a constituent layer inside the organic light emitting diode 6 can be reduced, and, as a result, a possibility that the organic light emitting diode 6 does not emit light can be further reduced.

In addition, in a case in which a through hole is formed in the frame area 44, and the first inorganic layer 98 and the second inorganic layer 106 are brought into tight contact with each other using the through hole formed in the frame area 44, although there is no through hole in the display area 43 as illustrated in Examples 1 to 4, the possibility of the occurrence of peeling-off in a constituent layer inside the organic light emitting diode 6 can be reduced. In a case in which no through hole is formed in the display area 43, the width of the bank 112 in the display area 43 can be configured to be small, and accordingly, both the realization of high accuracy and suppression of peeling-off in a constituent layer inside the organic light emitting diode 6 can be achieved. In addition, in a case in which through holes are formed in both the display area 43 and the frame area 44, and the first inorganic layer 98 and the second inorganic layer 106 are brought into close contact with each other using the through holes, the possibility of the occurrence of peeling-off in a constituent layer inside the organic light emitting diode 6 can be further reduced.

The configuration of the arrangement relation among the eleventh through hole 142 and the first inorganic layer 98 and the second inorganic layer 106 illustrated in FIG. 14 is one example, and any other configuration may be employed as long as a configuration bringing the first inorganic layer 98 and the second inorganic layer 106 into tight contact with each other can be realized. For example, the arrangement relation among the first through hole 122, the first inorganic layer 98, and the second inorganic layer 106 illustrated in Example 1 with reference to FIG. 3 may be applied as the arrangement relation among the eleventh through hole 142 and the first inorganic layer 98 and the second inorganic layer 106 in Example 5. Similarly, the arrangement relation among the first through hole 122, the first inorganic layer 98, and the second inorganic layer 106 illustrated in Example 2 with reference to FIG. 4, Example 3 illustrated in FIG. 5, or illustrated in Example 4 with reference to FIG. 6 may be applied as the arrangement relation among the eleventh through hole 142 and the first inorganic layer 98 and the second inorganic layer 106 in Example 5.

In a category of the idea of the present invention, a person skilled in the art may reach various changed examples and various modified examples, and it is understood that the changed examples and the modified examples belong to the scope of the present invention. For example, addition, deletion, or a design change of a constituent element for each embodiment described above or addition, omission, or a condition change of a process, which is appropriately made by a person skilled in the art, also belongs to the scope of the present invention as long as the concept of the present invention is included.

In addition, other operations and effects caused by the aspects described in the embodiment that are clear from the description of the specification or can be appropriately reached by a person skilled in the art are naturally interpreted as being caused by the present invention.

What is claimed is:

1. A display device comprising:
   a substrate;
   a first transistor and a second transistor on the substrate;
   an underlying structure layer;
   a first lower electrode electrically connected to the first transistor that is arranged on the underlying structure layer;
   multiple lower electrodes including a second lower electrode electrically connected to the second transistor and adjacent to the first lower electrode;
   an organic layer that is arranged on the multiple lower electrodes;
   an upper electrode that is arranged on the organic layer;
   a bank covering an edge of the first lower electrode and an edge of the second lower electrode:
   a first through hole that is arranged between the first lower electrode and the second lower electrode and includes a first inorganic layer at least in a part of an inner face; and
   wherein a second inorganic layer is in direct contact with the first inorganic layer in the inner face of the first through hole, and
   a biggest distance between the substrate and a top surface of the first inorganic layer in the first through hole is smaller than a distance between the substrate and a top surface of the bank.

2. The display device according to claim 1, wherein at least a part of the first inorganic layer is arranged closer to the underlying structure layer than a position between the upper electrode and the organic layer.

3. The display device according to claim 1, wherein at least a part of the first inorganic layer is arranged closer to the underlying structure layer than a position between two layers included in the organic layer.

4. The display device according to claim 1, wherein at least a part of the first inorganic layer is arranged closer to the underlying structure layer than a position between the organic layer and the first lower electrode.

5. The display device according to claim 1, wherein the first through hole is arranged inside the bank, the first inorganic layer is arranged at least in a part of the bank and is exposed from the inner face of the first through hole, and the second inorganic layer is arranged from an upper side of the upper electrode and an upper side of the bank to the inner face of the first through hole and is in contact with the first inorganic layer.

6. The display device according to claim 5, further comprising:
   a second through hole that is arranged inside the bank, wherein
   the first inorganic layer is arranged at least in a part of the bank and is exposed from an inner face of the second through hole, and
   the second inorganic layer is arranged on the upper electrode and in the inner face of the second through hole and is in contact with the first inorganic layer.

7. The display device according to claim 6, wherein at least a part of the inner face of the second through hole has an inclination angle of 85 degrees or more with respect to an upper face of a flattening film included in the underlying structure layer.

8. The display device according to claim 6, wherein a stacking body containing materials of the organic layer and the upper electrode is arranged at a bottom of the second through hole.

9. The display device according to claim 1, wherein the first through hole is arranged in the bank, the first through hole reaches the underlying structure layer, the first inorganic layer is in contact with at least a part of the underlying structure layer and is exposed from the inner face of the first through hole, and the second inorganic layer is arranged on the upper electrode and in the inner face of the first through hole and is in contract with the first inorganic layer.

10. The display device according to claim 9, further comprising:
    a second through hole that is arranged in the bank and reaches the underlying structure layer, wherein
    the first inorganic layer is in contact with at least a part of the underlying structure layer and is exposed from the inner face of the second through hole, and
    the second inorganic layer is arranged on the upper electrode and in the inner face of the second through hole and is in contact with the first inorganic layer.

11. The display device according to claim 1, wherein
at least a part of the inner face of the first through hole has an inclination angle of 85 degrees or more with respect to an upper face of a flattening film included in the underlying structure layer.

12. The display device according to claim 1, wherein
the first inorganic layer contains at least one of silicon nitride, silicon oxide, and silicon oxynitride as a composition material.

13. The display device according to claim 1, wherein
the second inorganic layer contains at least one of silicon nitride, silicon oxide, and silicon oxynitride as a composition material.

14. The display device according to claim 1, wherein
a stacking body containing materials of the organic layer and the upper electrode is arranged at a bottom of the first through hole.

15. A method of manufacturing a display device, the method comprising:
preparing a substrate and a first transistor and a second transistor;
preparing an underlying structure layer on the first transistor and the second transistor;
disposing a first lower electrode electrically connected to the first transistor and on the underlying structure layer;
disposing multiple lower electrodes including a second lower electrode electrically connected to the second transistor and adjacent to the first lower electrode;
disposing an organic layer on the multiple lower electrodes;
disposing an upper electrode on the organic layer;
disposing a bank covering an edge of the first lower electrode and an edge of the second lower electrode;
disposing a first through hole having a first inorganic layer at least in a part of an inner face between the first lower electrode and the second lower electrode;
disposing a second inorganic layer on the upper electrode; and
bringing the first inorganic layer and the second inorganic layer into direct contact with each other in the inner face of the first through hole, wherein
a biggest distance between the substrate and a top surface of the first inorganic layer in the first through hole is smaller than a distance between the substrate and a top surface of the bank.

16. The method of manufacturing a display device according to claim 15, wherein
the underlying structure layer including the first inorganic layer is prepared in the preparing of an underlying structure layer, and
the first inorganic layer in the underlying structure layer is exposed from at least a part of the inner face of the first through hole in the disposing of the first through hole.

17. The method according to claim 15, further comprising:
disposing a bank including the first inorganic layer between the first lower electrode and the second lower electrode on the underlying structure layer, wherein
the first inorganic layer in the bank is exposed from at least a part of the inner face of the first through hole in the disposing of the first through hole.

* * * * *